United States Patent [19]

Yamamoto

[11] 4,445,992

[45] May 1, 1984

[54] PLATING APPARATUS

[75] Inventor: Kenji Yamamoto, Tokyo, Japan

[73] Assignee: Electroplating Engineers of Japan, Limited, Tokyo, Japan

[21] Appl. No.: 415,872

[22] Filed: Sep. 8, 1982

[30] Foreign Application Priority Data

Sep. 10, 1981 [JP] Japan .................................. 56-141649

[51] Int. Cl.³ ........................ C25D 17/06; C25D 17/28
[52] U.S. Cl. .................................... 204/203; 204/224 R
[58] Field of Search .................... 204/198, 203, 224 R

[56] References Cited

U.S. PATENT DOCUMENTS 3,391,073 7/1968 Rusch ................................. 204/203
3,860,499 1/1975 Graham ......................... 204/224 R
4,083,755 4/1978 Murata ............................ 204/224 R Primary Examiner—T. M. Tufariello
Attorney, Agent, or Firm—Flynn, Thiel, Boutell & Tanis

[57] ABSTRACT

A plating apparatus for automatic plating of objects to be plated such as IC lead frames in a plural number in considerably high speed as a whole process line in which plural number of aligned object to be plated in the form of strips is conveyed laterally at a time on the conveyed line which is formed with aligning rollers group and the feed rollers group, while conveying, the objects to be plated are carried out pre-treatment and after-treatment, between both of treatments, the plating treatment is carried out by injection of plating liquid to the objects to be plated, and as loading a vacuum apparatus moving with arc-shaped track is employed for transferring plural objects to be plated in one on a conveyor line.

8 Claims, 7 Drawing Figures

PLATING APPARATUS

BACKGROUND OF THE INVENTION

The present invention relates to a plating apparatus, and more particularly, an apparatus for automatically plating objects such as IC lead frames and other objects in the form of strips.

In plating objects such as IC lead frames and other objects in the form of strips, simultaneous plating of plural objects is required in order to enhance efficiency. Processing speed of the plating is determined in accordance with the treating speed of the whole processing line comprising various stations such as loading, pre-treatment, plating, after-treatment and unloading stations. Several types of plating apparatus of this kind have been conceived and employed, however, the processing speed of the whole line is comparatively slow.

BRIEF EXPLANATION OF THE INVENTION

Prior to the present invention, the inventor proposed a plating apparatus to efficiently carry out automatic plating operation of conveying and plating objects to be plated, aligning and locating a plurality of objects on a carrier which is handled as a rack (Japanese Patent Laying-Open No. 99127/81, U.S. Pat. No. 4,318,793).

According to the above proposed plating apparatus, the processing speed is increased substantially compared with the conventional plating apparatus, whereas further acceleration of the processing speed cannot be obtained since it employs a carrier to convey the objects to be plated.

THE SUMMARY OF THE INVENTION

The object of this invention is to provide a plating apparatus which enables acceleration of automatic plating by employing a plurality of rollers instead of a carrier, as well as a newly-designed loading device which conveys plural objects to be plated to the assembly line at a time.

The above mentioned and other objects, advantages, features and uses will become more apparent as the description proceeds, when considered with the accompanying drawings.

DETAILED DESCRIPTION OF THE PREFEREED EMBODIMENT

Figure 1:
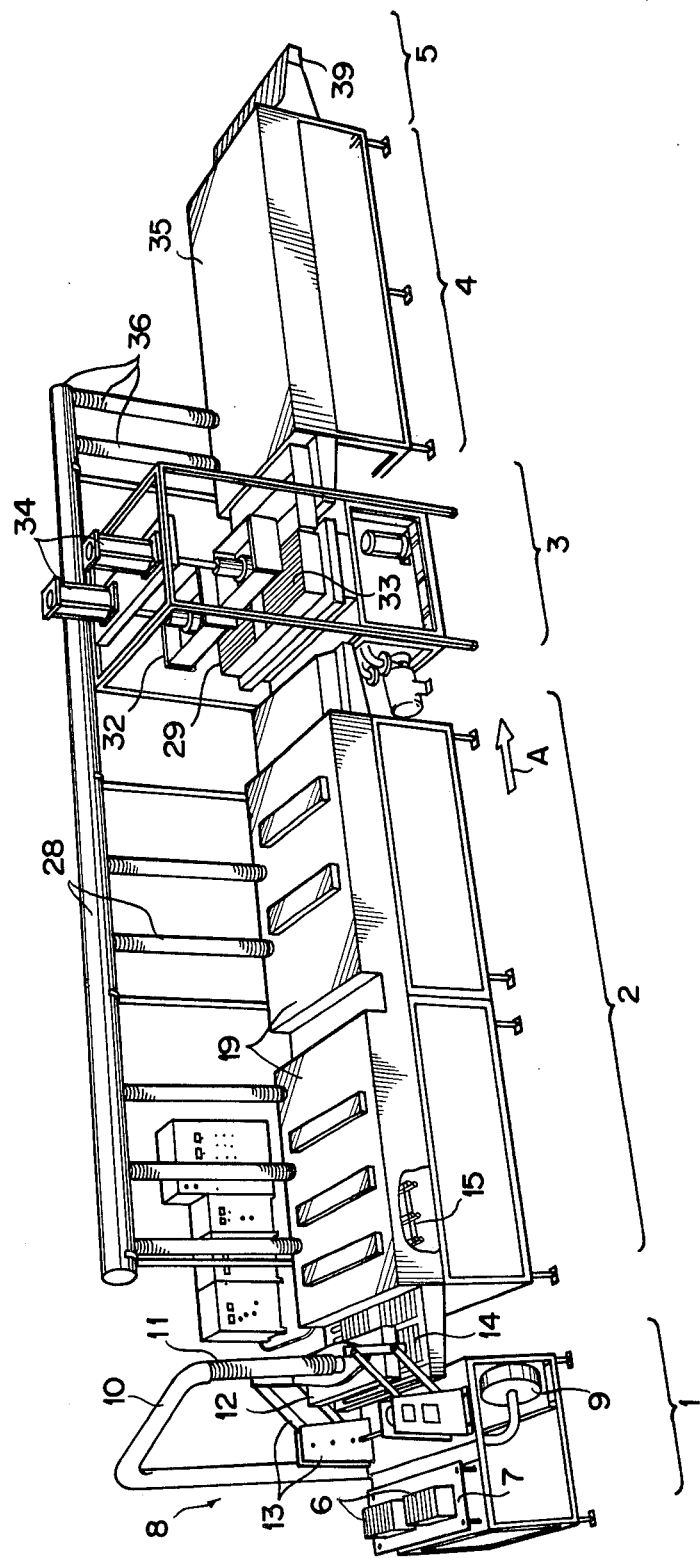
FIG. 1 is a diagramatic perspective view showing an embodiment of plating apparatus according to the present invention.

The detailed description of the invention will be made referring to the illustrated embodiment. This plating apparatus is comprised of loading apparatus 1, pre-treatment apparatus 2, plating device 3 which injects plating liquid to carry out plating, after-treatment apparatus 4, and unloading apparatus 5 in the order of the direction of conveying the objects to be plated 6 as indicated by arrow A (FIG. 1).

Figure 2:
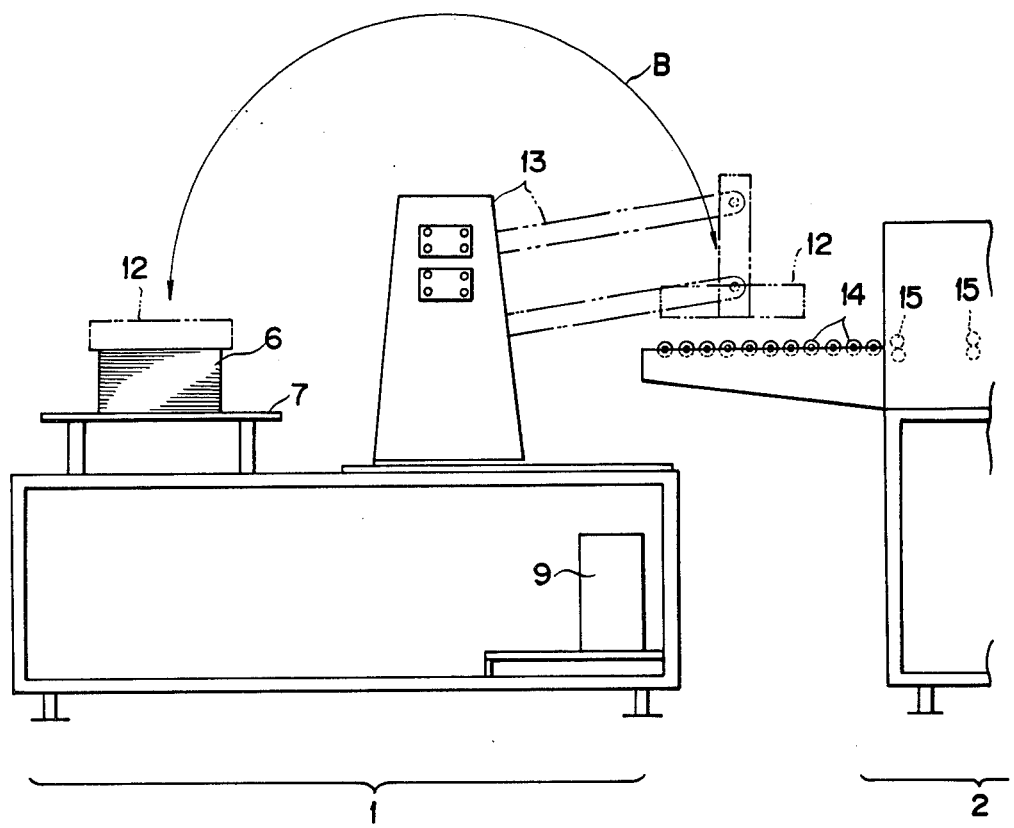
FIG. 2 is a view illustrating the path of movement of the suction pad.

The loading apparatus 1 is mainly provided with deck 7 which preliminarily aligns and loads the objects to be plated 6 (in the illustrated example, IC lead frames in the form of strips), and vacuum apparatus 8 which reciprocates between the said deck 7 and aligning rollers of the pre-treatment apparatus 2 which will be described after. The vacuum apparatus 8 is mainly provided with suction pad 12 which is located at the end of movable duct 10, 11 which duct is connected with blower 9, and link mechanism 13 enabling the said suction pad 12 to reciprocate through arcuate tracks of inverted U-shaped form (in the direction of arrow B) (FIG. 2).

Figure 3:
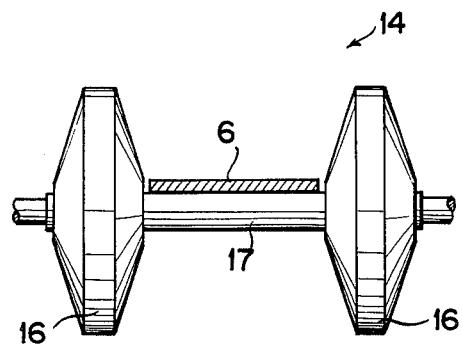
FIG. 3 is a diagramatic view of tapered rollers forming a group of aligning rollers as well as flat rollers.
Figure 4:
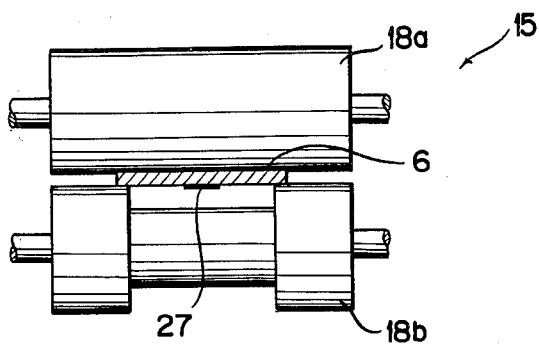
FIG. 4 is a diagramatic view of the rollers forming of a group of feed rollers.

The pre-treatment apparatus 2 performed various processes, for example, electrolytic degreasing, washing with water, washing with acid, neutralizing, washing with water, striking and washing with water, and so on. And the said pre-treatment apparatus 2 is provided with aligning rollers group 14 which is located at the inlet portion and also is provided with feed rollers group 15 which is located in the inside thereof (see FIGS. 1, 2 and 3). The aligning rollers group 14 is formed with a plural number of units of a pair of right and left tapered rollers 16 and flat rollers 17 which is provided between the said tapered rollers 16, and these units are aligned in parallel in the direction indicated by arrow A. The number of units corresponds with that of objects to be plated 6 which are aligned and loaded on the deck 7. The feed rollers group 15 is formed with plural numbers of units of a pair of upper and lower engaging rollers 18a, 18b, which are located in parallel in the direction indicated by arrow A with the same number of units of the aligning rollers group 14, (see FIGS. 1, 4 and 5). Processing apparatuses of electrolytic degreasing and washing with water which are located in the inside of treatment tank 19 of pre-treatment apparatus 2 are those of well-known types and they are not explained here.

Figure 5:
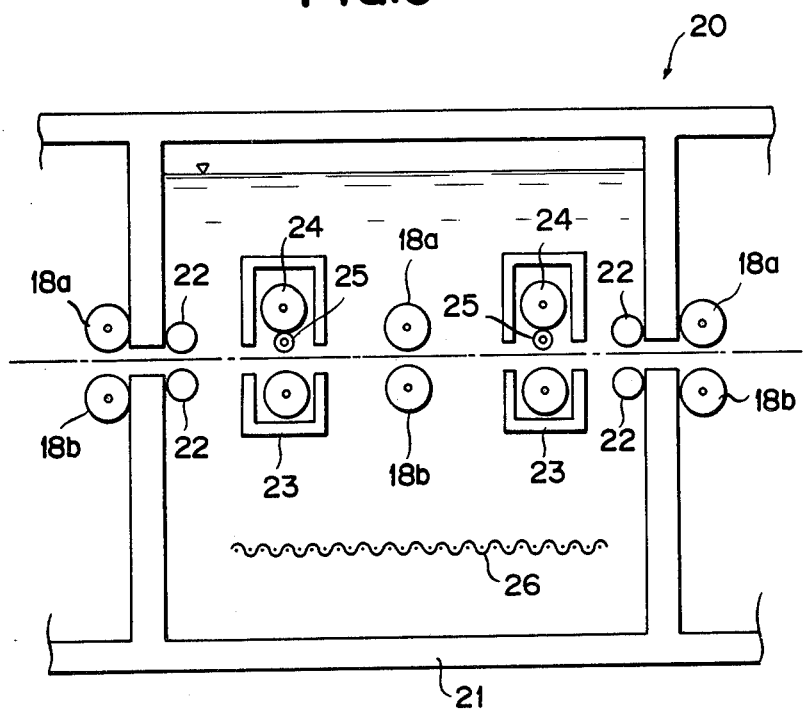
FIG. 5 is a diagramatic side view of the corresponding part of the pre-treatment apparatus, in which the striking process is performed

Explained now referring to the FIG. 5 is striking apparatus 20. Numeral number 21 denotes a parting tank, the inlet and outlet of which are each provided with a pair of adjacent upper and lower leak-prevention pipes 22. And inside the said parting tank 21, are provided the casing 23 for preventing striking plating of the equipment of rollers, a pair of upper and lower back-up rollers 24 and rollers for cathode 25. Numeral number 26 denotes a meshed anode. Referring to the engaging rollers 18a and 18b of the said feed roller group 15 located in the above mentioned parting tank 21, the lower engaging roller 18b is formed as being a groove roller shown in FIG. 4 and is so designed as not to be in contact with surface to be plated 27, that is, portion to be plated of the object to be plated 6. The said engaging rollers 18a, 18b are located in parallel with a space which is slightly shorter than that of length of the object to be plated 6. Additionally, numeral number 28 denotes a duct located at treatment tank 19 in accordance with the sort of the processes including in the pre-treatment apparatus 2.

Figure 6:
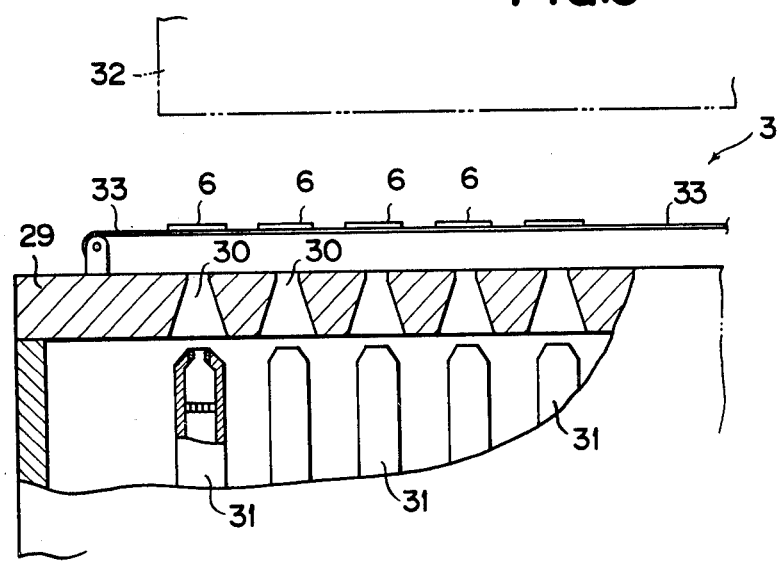
FIG. 6 is a partly diagramatic sectional view of the plating device.

Through the loading apparatus 1 and the pre-treatment apparatus 2, plural objects to be plated 6 in the form of strips are conveyed consecutively to the plating device 3 and then further conveyed to the upper surface of top plate 29 of the said plating device 3 in an aligned condition through grab device which is not illustrated. Upon the completion of the plating, the plural objects to be plated 6 are conveyed to the inlet of the after-treatment apparatus 4 through the grab device which is not illustrated in the figure. As shown in FIGS. 1 and 6 the plating device 3 is mainly provided with the top plate 29, serving also as a masking, which is formed with plural numbers of injection apertures 30 for plating liquid, nozzles 31 also serving as anodes facing the injection apertures 30 and a pressure plate 32 which is movable upwardly and downwardly for pressing the objects to be plated 6 to the upper surface of the top plate 29. Numeral number 33 denotes a wire which is stringed on the upper side of the top plate 29, and the objects to be plated 6 descend in a condition of being loaded on the wire 33 by the flexion of wire 33 in accordance with the descending of the pressure plate 32, and the plating part of the objects to be plated 6 are positioned in accordance with the injection aperture 30 of the plating liquid. When the pressure plate 32 ascends, the said wire 33 removes the objects to be plated 6 from the top plate 29 by its own tensile force. Numeral number 34 denotes a pressure cylinder which provides the upward and outward motion of the pressure plate 32.

Processing of the after-treatment apparatus 4 includes some processes in the treatment tank 35, for example, recovery, removal, washing with pure water and drying and so on. In the inlet of the said after-treatment apparatus 4, aligning rollers group (not illustrated) such as a group like the aligning rollers group 14 of the pre-treatment apparatus 2 is located and at the inside of the tank 35 a feed rollers group (not illustrated) like the feed rollers group 15 of the pre-treatment apparatus 2 is located. Numeral number 36 denote a duct. Further processing apparatuses for the said after-treatment process can employ the already known apparatus, therefore, detailed explanation is not given here.

Figure 7:
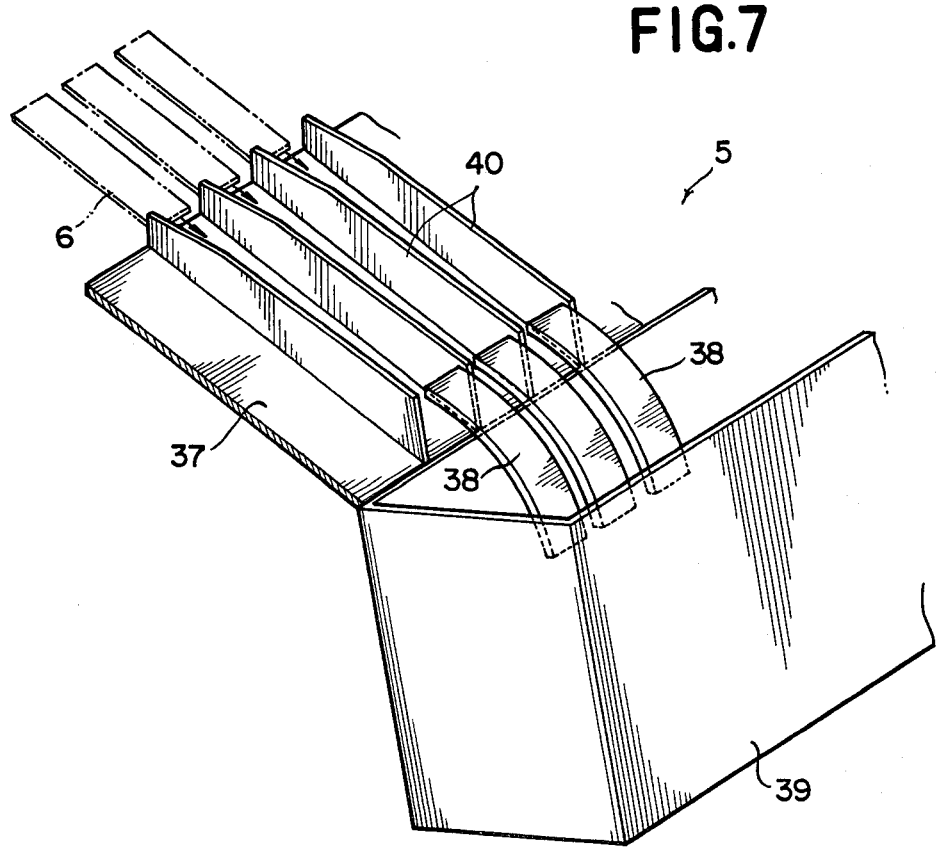
FIG. 7 is a diagramatic perspective view of the unloading apparatus.

As shown in FIGS. 1 and 7, the unloading apparatus 5 is mainly provided with sloping guide plate 37 which slides off the objects to be plated 6, curved guide plate 38 located on the upper part of lower ends of the sloping guide plate 37 controlling the slip-off direction of the objects to be plated 6, and containing box 39 which is located on the lower part of the said curved guide plate 38 and can contain the piled plural objects to be plated 6. The said sloping guide plate 37, curved guide plate 38 and containing box 39 are provided in plural and are located in parallel in accordance with the number of aligned objects. Numeral number 40 denotes the partition wall of the plate 37.

Following is a detailed description of the operation under the present invention. The plural numbers of the objects 6 to be plated already aligned and loaded on the deck 7 are sucked to the lower side of the suction pad 12 and are held by this pad 12. They are then conveyed in the direction indicated by arrow B through an arc-shaped track. Compared with the conventional apparatus in which the vacuum apparatus (not illustrated) conveys the suction pad in a rectangular path in the order of ascend, lateral movement and descend, the track in the present invention is arc-shaped and consequently prompt and smooth loading of the objects to be plated 6 can be achieved. Utilizing its tapered shape, a pair of right and left tapered rollers 16 of the aligning rollers group 14 receives the plural numbers of the objects to be plated 6 supplied by the suction pad 12, positions their respective alignment, conveys the plural numbers of the objects 6 in parallel condition at a time horizontally through the flat rollers 17 in the direction indicated as arrow A, and feeds them to the engaging rollers 18a, 18b of the feed rollers group 15.

The plural objects to be plated 6 are subjected to various pre-treatments while they are conveyed through the treatment tank 19, by the engaging rollers 18a, 18b. In the striking process, for example, when cathode rollers 25 contact the upper side of the object to be plated 6 the meshed anode 26 located at the bottom of the parting tank 21 which is filled with striking plating liquid, supplys ions to provide satisfactory striking plating, i.e. copper striking plating to the objects to be plated 6. The plural objects to be plated 6 are then conveyed to the top plate 29 of the plating device 3, more specifically, on the wire 33 at a time in aligned condition and descends with the wire 33 by pressure of the pressure plate 32 by means of the pressure cylinder 34. The plating part of the objects to be plated 6 is positioned in accordance with the injection aperture 30 for the plating liquid where the part to be plated is exposed and fixed under the pressure on the top plate 29, also serving as a masking. The plating liquid is injected from the nozzles 30, also serving as the anode, to carry out plating, i.e. partial silver plating, to the plating part of the objects to be plated 6. By ascending and returning movement of the pressure plate 32 and by recovery of the wire 33, the objects to be plated 6 are now free from the fitting condition with the top plate 29, and returned to the original position illustrated in FIG. 6. The plural objects to be plated 6 are conveyed at a time to the upper part of the aligning rollers group (not illustrated) located at the inlet of the after-treatment apparatus 4 by the grab device not shown and the feed rollers group (not illustrated) then feeds the objects to be plated 6 in lateral condition for the after-treatment in accordance with each step required. Upon completion of the after-treatment, each object to be plated 6 slips off on the sloping guide plate 37 between a pair of right and left partition wall 40 falling down in the direction which is controlled by the curved guide plate 38, and finally is contained in the containing box 39. In case that the containing box 39 is filled up with piles of the plural objects to be plated 6, they are picked out.

According to the present invention, the objects to be plated can be carried out, pre-treatment and after-treatment in the pre-treatment apparatus and after-treatment apparatus being conveyed laterally by means of the rollers group instead of a carrier as a rack, the plating is carried out by injection of the plating liquid, and the loading is achieved promptly by moving with arc-shaped tracks of the suction pad of the vacuum apparatus. The processing speed of the whole line, therefore, can be increased substantially, which leads to efficient handling of automatic plating of the plural objects to be plated in the form of strips such as IC lead frames which are difficult to handle.

I claim:

1. An apparatus for electroplating strip-form objects, comprising:
   a loading apparatus for feeding a series of rows of the objects, in succession, in a longitudinal feeding direction, each row of the objects extending transversely to said longitudinal feeding direction and comprising a plurality of the objects arranged in side-by-side, laterally aligned relationship;

a pre-treatment apparatus for receiving said rows of the objects in succession from said loading apparatus and subjecting same to pre-treatments effective to prepare the objects for electroplating, said pre-treatment apparatus comprising a first group of aligning rollers for longitudinally aligning each object in a row with the corresponding object in the preceding row whereby the objects are arranged in rank and file order, said pre-treatment apparatus also comprising a first group of feed rollers for receiving the objects from said aligning rollers and moving the objects in rank and file order in said longitudinal feeding direction through said pre-treatment apparatus;

a plating apparatus for receiving the objects discharged from said pre-treatment apparatus one row at a time, said plating apparatus including a partial plating device for injecting electroplating liquid against a portion of the surface of each of the objects to effect electroplating of parts of said surfaces of the objects;

an after-treatment apparatus for receiving said rows of the objects in succession from said plating apparatus and subjecting same to after-treatments for cleaning the objects, said after-treatment apparatus comprising a second group of aligning rollers for longitudinally aligning each object in a row with the corresponding object in the preceding row whereby the objects are again arranged in rank and file order, said after-treatment apparatus also comprising a second group of feed rollers for receiving the objects from the second group of aligning rollers and moving the objects in rank and file order in said longitudinal feeding direction through said after-treatment apparatus;

and an unloading apparatus for unloading the objects from said after-treatment apparatus.

2. The apparatus as claimed in claim 1, in which said loading apparatus comprises a deck for holding stacks of the objects, the stacks of objects being arranged in a row that extends transversely to said longitudinal feeding direction, a vacuum apparatus having a suction pad for simultaneously lifting the uppermost object in each of said stacks and transferring same to said pre-treatment apparatus, and a link mechanism for reciprocating said suction pad between said deck and said pre-treatment apparatus so that said suction pad moves through a path of inverted U-shaped form.

3. An apparatus as claimed in claim 1 or claim 2, wherein said first and second groups of aligning rollers each comprise a series of longitudinally spaced-apart shafts extending transversely to said longitudinal feeding direction, each shaft having a series of aligning rollers thereon, said aligning rollers having opposing surfaces which are arranged in pairs that taper toward each other in the direction toward said shaft, and a conveying roller located between the radially inner ends of said pairs of tapered surfaces, there being a pair of said tapered surfaces and a conveying roller for each object in the row so that each object can be fed between a pair of said tapered surfaces so that said objects are moved into rank and file order.

4. An apparatus as claimed in claim 1 or claim 2, wherein said first and second groups of feed rollers each comprise a plurality of pairs of upper and lower feed rollers respectively engageable with the upper and lower surfaces of the objects, the pairs of upper and lower feed rollers being arranged in transverse rows extending transversely to said longitudinal feeding direction and in longitudinal rows extending in said longitudinal feeding direction, said transverse rows containing a pair of said upper and lower feed rollers for each object in a row of objects.

5. An apparatus as claimed in claim 4, wherein the lower roller of each pair of said upper and lower rollers is provided with groove means so that contact of said lower roller with the part to be plated of the object is prevented.

6. An apparatus as claimed in claim 1, wherein said pretreatment apparatus comprises a device for applying a strike plating to the objects, and said partial plating device comprises a top plate having upwardly opening plural injection apertures for directing plating liquid upwardly against portions of the lower surfaces of the objects, said top plate also acting to mask the lower surfaces of the objects, nozzles disposed below said top plate for injecting the plating liquid upwardly into and through said injection apertures, said nozzles being connected as electroplating anodes, and an upwardly and downwardly movable pressure plate for pressing the objects to be plated against the upper surface of said top plate.

7. An apparatus as claimed in claim 6, including a plurality of wires located between said pressure plate and said top plate and extending across said top plate so that when said pressure plate descends, said wires flex to rest on the upper surface of the said top plate in order to position the objects to be plated against said injection apertures, and when said pressure plate ascends, said wires remove the objects to be plated from said top plate.

8. An apparatus as claimed in claim 1, wherein said unloading apparatus comprises a sloping guide plate to permit the objects to be slid off, a plural number of partition walls extending upwardly from said sloping guide plate to provide slots therebetween corresponding to the width of the objects to be plated, a plurality of curved guide plates which is located above said guide plate adjacent to the lower end thereof to control the sliding direction of the objects, and a box located at the lower ends of the said curved guide plates for containing piles of the objects to be plated.

* * * * *